United States Patent
Simpson

(10) Patent No.: US 10,267,841 B2
(45) Date of Patent: Apr. 23, 2019

(54) MONITORING ARRANGEMENT

(71) Applicant: Viper Innovations Limited, Bristol (GB)

(72) Inventor: Steve Simpson, Bristol (GB)

(73) Assignee: Viper Innovations Limited, Bristol (GB)

( * ) Notice: Subject to any disclaimer, the term of this patent is extended or adjusted under 35 U.S.C. 154(b) by 138 days.

(21) Appl. No.: 15/460,630

(22) Filed: Mar. 16, 2017

(65) Prior Publication Data

US 2017/0276717 A1 Sep. 28, 2017

(30) Foreign Application Priority Data

Mar. 23, 2016 (GB) .................................. 1604941.3

(51) Int. Cl.
*G01M 11/00* (2006.01)
*G01R 31/08* (2006.01)
*G01R 31/11* (2006.01)

(52) U.S. Cl.
CPC ....... *G01R 31/083* (2013.01); *G01M 11/3154* (2013.01); *G01R 31/11* (2013.01)

(58) Field of Classification Search
CPC .................................................. G01R 31/083
USPC ........................................................ 370/242
See application file for complete search history.

(56) References Cited

U.S. PATENT DOCUMENTS

| 8,281,862 | B2 | 10/2012 | Barber et al. |
| 8,381,578 | B2 | 2/2013 | Sweeney |
| 8,430,168 | B2 | 4/2013 | Goodall et al. |
| 8,575,945 | B2 | 11/2013 | Douglas |
| 8,746,042 | B2 | 6/2014 | Sweeney |
| 8,803,530 | B2 | 8/2014 | Stokes |
| 9,188,246 | B2 | 11/2015 | Sweeney |
| 9,244,117 | B2 | 1/2016 | Furse et al. |
| 2004/0100273 | A1 | 5/2004 | Liney et al. |
| 2008/0210682 | A1* | 9/2008 | Francis ............... H05B 3/56 219/494 |
| 2009/0288836 | A1 | 11/2009 | Goodall et al. |
| 2010/0089126 | A1 | 4/2010 | Sweeney |
| 2011/0227582 | A1* | 9/2011 | Ahamed ............ G01R 31/11 324/533 |
| 2011/0253377 | A1 | 10/2011 | Barber et al. |

(Continued)

FOREIGN PATENT DOCUMENTS

| AU | 2017201627 | 10/2017 |
| AU | 2017201627 | 12/2017 |

(Continued)

OTHER PUBLICATIONS

Smith et al., "Analysis of Spread Spectrum Time Domain Reflectometry for Wire Fault Location", IEEE Sensors Journal vol. 5, No. 6, Dec. 2005, United States, pp. 1469-1477.

*Primary Examiner* — Shripal K Khajuria
(74) *Attorney, Agent, or Firm* — Wells St. John P.S.

(57) ABSTRACT

A monitoring arrangement is described for use in monitoring the condition of an umbilical extending between a first location and a second location, the monitoring arrangement comprising a first SSTDR monitoring unit electrically connected to the umbilical at the first location and monitoring the condition of a first part of the umbilical, and a second SSTDR monitoring unit electrically connected to the umbilical at the second location and monitoring the condition of a second part of the umbilical.

14 Claims, 2 Drawing Sheets

(56) References Cited

U.S. PATENT DOCUMENTS

Figure 1:
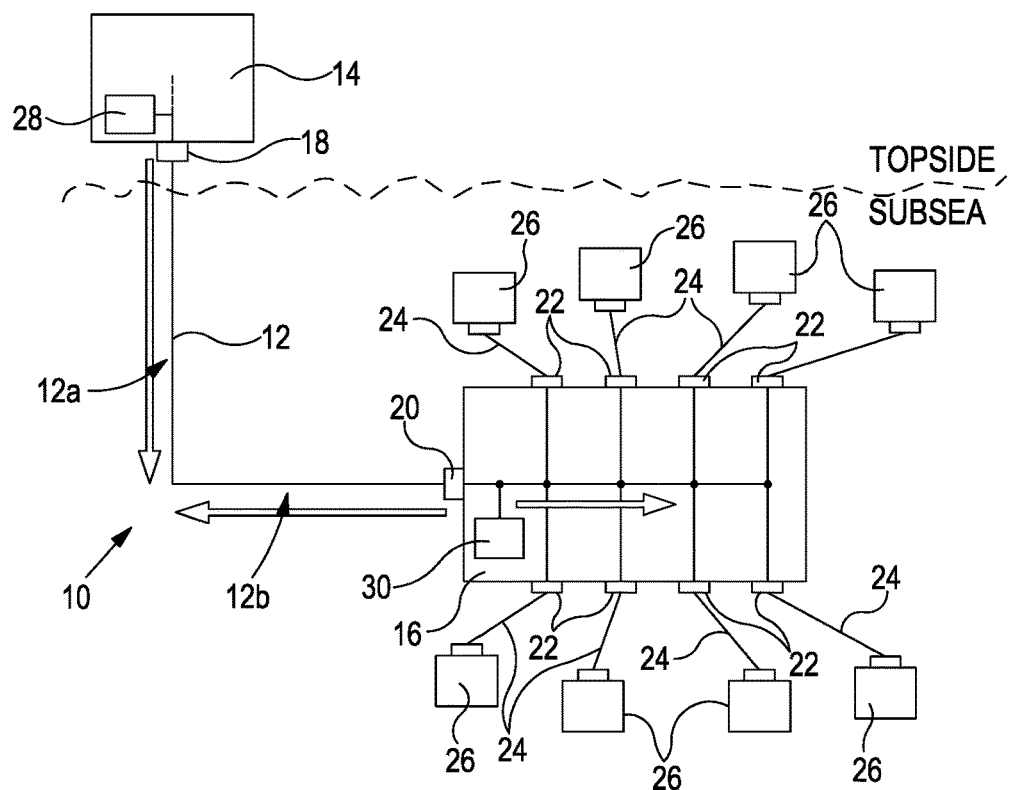

| | | | |
|---|---|---|---|
| 2011/0291661 A1* | 12/2011 | Stokes | G01R 31/11 |
| | | | 324/528 |
| 2011/0298467 A1 | 12/2011 | Douglas | |
| 2012/0174676 A1* | 7/2012 | Nyffenegger | G01V 1/186 |
| | | | 73/647 |
| 2012/0182835 A1* | 7/2012 | Davis | G01S 3/80 |
| | | | 367/118 |
| 2013/0160525 A1 | 6/2013 | Sweeney | |
| 2013/0201790 A1* | 8/2013 | Manin | G01V 1/3808 |
| | | | 367/16 |
| 2014/0234029 A1 | 8/2014 | Sweeney | |
| 2014/0266238 A1* | 9/2014 | Furse | G01R 31/2841 |
| | | | 324/533 |

FOREIGN PATENT DOCUMENTS

| | | |
|---|---|---|
| GB | 2460170 | 11/2009 |
| GB | 2476152 | 6/2011 |
| GB | 2480619 | 11/2011 |
| GB | 1604941.3 | 9/2016 |
| WO | WO 2011/128653 | 10/2011 |

\* cited by examiner

MONITORING ARRANGEMENT

RELATED PATENT DATA

This application claims priority to GB Patent Application Serial No. 1604941.3, which was filed on Mar. 23, 2016, the teachings of which are incorporated herein by reference.

This invention relates to a monitoring arrangement, and in particular to a monitoring arrangement whereby the electrical integrity of a subsea umbilical or cable or subsea equipment can be undertaken.

In the oil and gas extraction industry, it is common for equipment to be located upon the seabed, the equipment being powered via cables known as umbilicals extending to the sea surface or another location, for example on land, and similarly controlled via the umbilicals. The umbilicals may thus carry, for example, electrical power, pressurised hydraulic fluids used to drive equipment for operation, and/or electrical and/or optical control or communications signals.

Umbilicals used in the subsea oil and gas industry vary significantly in length. In some situations they may be of length in the region of a few hundred meters. However, they are often considerably longer than this, for example extending to a length of 150 km or more. A typical length for an umbilical is in the range of 3 to 50 km, but as noted above, there are applications in which the umbilical length falls outside of this range.

It is desirable to be able to monitor the condition of the umbilical and equipment connected thereto so as to allow the identification and rectification of faults in a timely manner. Such monitoring is especially desirable as subsea operating environments are particularly harsh for electrical equipment. By way of example, failure of the electrical insulation of an electrical conductor in a subsea environment can easily result in the generation of short circuits which may be damaging to other subsea located equipment. The rapid identification of faults can allow the spread of such damage to other equipment to be avoided or reduced.

One technique that may be used in monitoring the condition of cables is spread spectrum time domain reflectometry (SSTDR). It is thought that it would be desirable to use this monitoring technique in monitoring the condition of subsea umbilicals as it would allow the derivation of additional diagnostic information. However, SSTDR techniques are limited in the sense that the length of a cable that can be monitored using this type of technique is restricted. By way of example, the maximum length of cable that can be monitored using this technique is typically in the region of 6 km, although in some circumstances lengths of up to about 12 km can be monitored. Whilst it may be possible to use the technique in monitoring relatively short umbilicals, as noted above umbilicals are often of considerably greater length than the maximum length with which SSTDR techniques can normally be used. Accordingly, SSTDR techniques have not typically been used in monitoring the condition of subsea umbilicals.

It is an object of the invention to provide a monitoring arrangement whereby SSTDR techniques can be used in monitoring the condition of umbilicals.

According to the invention there is provided a monitoring arrangement for use in monitoring the condition of an umbilical extending between a first location and a second location, the monitoring arrangement comprising a first SSTDR monitoring unit electrically connected to the umbilical at the first location and monitoring the condition of a first part of the umbilical, and a second SSTDR monitoring unit electrically connected to the umbilical at the second location and monitoring the condition of a second part of the umbilical.

Where used with relatively short umbilicals, it will be appreciated that the first and second parts may overlap one another.

It will be appreciated that by using two monitoring units in this manner, the length of the umbilical that can be monitored using SSTDR techniques is significantly increased. By way of example, if each individual SSTDR monitoring unit is capable of monitoring a 6 km length, then an umbilical of length in the region of 12 km can be monitored along substantially its full length.

The umbilical may be connected, at the second location, to a subsea distribution unit. Depending upon the nature of the subsea distribution unit, the second SSTDR monitoring unit may further be able to monitor the condition of the subsea distribution unit, or parts thereof, and equipment or cables connected thereto. By way of example, where the distribution unit is of the non-isolated type, for example of the bus bar type, the second SSTDR monitoring unit may be able to monitor the condition of the subsea distribution unit and cables or equipment connected thereto. Where the subsea distribution unit is of the isolated type, for example having transformer based connections to subsea located cables and equipment, then the second SSTDR monitoring unit, whilst still able to monitor the condition of part of the umbilical, will only be able to monitor the condition of part of the subsea distribution unit and not the condition of the cables or equipment connected thereto.

Where the subsea distribution unit is of the isolated type, the subsea distribution unit may include additional SSTDR monitoring units arranged to permit monitoring of parts of the subsea distribution unit and cable or equipment connected thereto that cannot be monitored by the second SSTDR monitoring unit.

The first SSTDR monitoring unit is preferably located within a topside control unit to which the umbilical is connected.

The second SSTDR monitoring unit is preferably located within the subsea distribution unit to which the umbilical is connected. Alternatively, it may be located within a termination unit associated with the second end of the umbilical.

The umbilical may be of length greater than can be monitored using the first and second SSTDR monitoring units. In such an arrangement, a central part of the umbilical may not be monitored. Since the central part of the umbilical will typically not include any, or many, connections, splices or the like to other system components, the likelihood of faults occurring therein is relatively low. The first and second SSTDR monitoring units provide monitoring of the parts of the umbilical most susceptible to faults.

The invention further relates to a topside control unit incorporating a first SSTDR monitoring unit and suitable for use in the arrangement set out hereinbefore, and to a distribution unit including a second SSTDR monitoring unit and suitable for use in the arrangement set out hereinbefore. The invention further relates to a subsea electrical distribution system comprising an umbilical, a first SSTDR monitoring unit electrically connected to the umbilical at a first location, and a second SSTDR monitoring unit electrically connected to the umbilical at a second location.

According to another aspect of the invention there is provided a monitoring method for use in monitoring the condition of an umbilical extending continuously between a first location and a second location, the monitoring method comprising using a first SSTDR monitoring unit located at or adjacent the first location and electrically connected to the umbilical at the first location to monitor the condition of a first part of the umbilical adjacent the first location, and using a second SSTDR monitoring unit located at or adjacent the second location and electrically connected to the umbilical at the second location to monitor the condition of a second part of the umbilical adjacent the second location.

Figure 2:
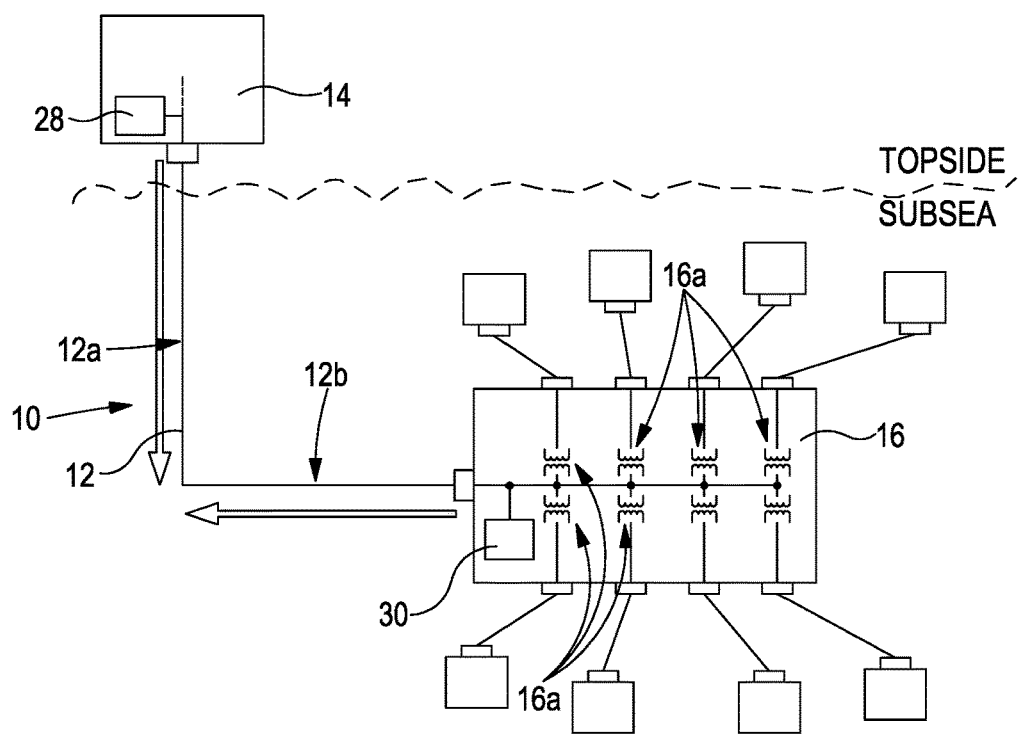
Figure 3:
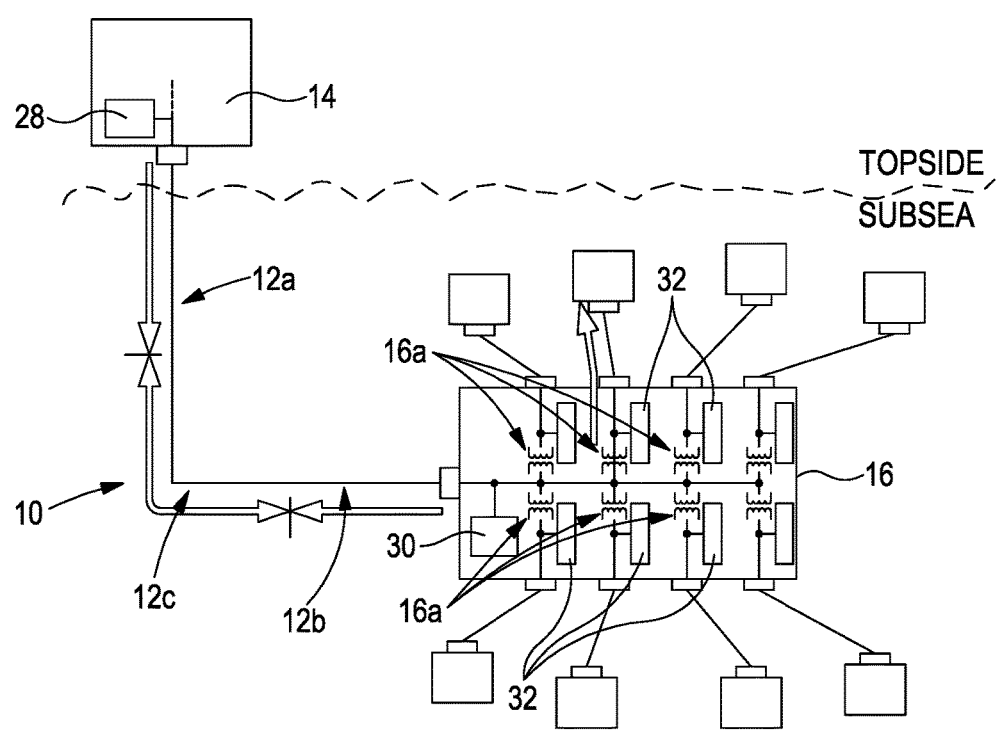

The invention will further be described, by way of example, with reference to the accompanying drawings, in which:

FIG. 1 is a diagrammatic illustration of a monitoring arrangement in accordance with an embodiment of the invention, in use, in a subsea electrical distribution system; and FIGS. 2 and 3 illustrate alternative embodiments.

Referring firstly to FIG. 1, a subsea electrical distribution system 10 is illustrated. The system 10 comprises an umbilical 12 whereby power and control signals are transmitted between a topside control unit 14, for example located at the surface or at another remote location such as on land, and a subsea distribution unit 16. The power and control signals may be transmitted by way of, for example, electrical conductors, optical fibres, hydraulic fluid carrying lines or the like provided in the umbilical 12.

As shown, the umbilical 12 is connected, at a first end thereof, by way of a first umbilical connector 18 to the topside control unit 14, and at a second end thereof, by way of a second umbilical connector 20 to the subsea distribution unit 16.

The subsea distribution unit 16 shown in FIG. 1 is of the non-isolated, bus bar type, containing a series of bus bars whereby the electrical conductors of the umbilical 12 are connected to connectors 22 allowing flying leads or cables 24 to be connected to the distribution unit 16, thereby allowing subsea located equipment 26 to be connected to the distribution unit 16 and via the umbilical 12 to the topside control unit 14. In addition, the distribution unit 16 may include connections allowing optical fibres and/or hydraulic lines or the like of the umbilical 12 to be connected via the connectors 22 and cables 24 to the equipment 26.

In accordance with the invention, a monitoring arrangement is provided to allow the condition of the umbilical 12 to be monitored. Accordingly, located within the topside control unit 14 is a first SSTDR monitoring unit 28 which is electrically connected to the first end of the umbilical 12 by way of the first connector 18. The first SSTDR monitoring unit 28 is operable to permit monitoring of the condition of a first part 12a of the umbilical 12 closest to the topside control unit 14. Located within the subsea distribution unit 16 and electrically connected to the second end of the umbilical 12 by way of the second connector 20 is a second SSTDR monitoring unit 30. The second SSTDR monitoring unit 30 is operable to monitor the condition of a second part 12b of the umbilical 12. In addition, the second SSTDR monitoring unit 30 is operable to monitor the condition of the distribution unit 16 and at least parts of the connectors 22, cables 24 and equipment 26 connected thereto.

SSTDR technology and its use in monitoring the condition of cables or the like is well known, and so the manner in which the SSTDR monitoring units 28, 30 operate is not described herein in detail.

In the arrangement illustrated, each SSTDR monitoring unit 28, 30 is capable of monitoring the condition of a section of the umbilical of length in the region of 6 km. It will be appreciated that, as shown in FIG. 1, therefore, the monitoring arrangement is capable of monitoring the condition of an umbilical 12 of length to up in the region of 12 km, the first SSTDR monitoring unit 28 monitoring the condition of the first part 12a which is of length approximately 6 km, and the second SSTDR monitoring unit 30 monitoring the condition of the part 12b which is of length 6 km. Not only does the use of the invention allow monitoring of an increased length of the umbilical 12, but also the SSTDR technology may be used to monitor the condition of umbilicals 12 when they are in use. Accordingly, the monitoring can be undertaken without the need to take the umbilical 12, distribution unit 16 and other parts of the system 10 out of service. Furthermore, monitoring of the condition of the subsea distribution unit 16 and system components connected thereto can be undertaken, allowing a much improved level of condition monitoring to be undertaken.

Whilst the description hereinbefore makes reference to the second SSTDR monitoring unit 30 as being located within the subsea distribution unit 16, this need not be the case and it may be located in other subsea locations. By way of example, it may be located within a termination assembly or unit associated with the second end of the umbilical 12.

FIG. 2 illustrates the application of the invention to a system 10 in which the subsea distribution unit 16 is of the isolated type, the distribution unit 16 including a series of transformers 16a through which electrical power and/or signals are transmitted between the umbilical 12 and the cables 24 and equipment 26. The presence of the transformers 16a prevents the second SSTDR monitoring unit 30 from being able to monitor the condition of the connectors 22, cables 24 and equipment 26. Accordingly, in the arrangement of FIG. 2, whilst the benefit of enabling monitoring of the condition of an increased length of umbilical 12 is achieved, the monitoring being able to be undertaken whilst the system 10 is live, monitoring of the condition of the connectors 22, cables 24 and equipment 26 cannot be undertaken using the second SSTDR monitoring unit 30.

In order to enable the monitoring of the condition of the connectors 22, cables 24 and equipment 26 in an isolated type distribution unit 16, as shown in FIG. 3, additional SSTDR monitoring units 32 may be provided within the distribution unit 16 connected between the transformers 16a and the connectors 22 so as to monitor the conditions of the connectors 22, cables 24 and equipment 26. Depending upon the application in which the invention is employed, only certain of the connectors 22, cables 24 and equipment 26 may be monitored, if desired. Whilst illustrated as being located within the distribution unit 12, the additional SSTDR monitoring units 32 may be located elsewhere, for example at the connectors 22. In this arrangement, therefore, the condition of the umbilical 12 is monitored using the first and second SSTDR monitoring units 28, 30 and the condition of the connectors 22, cables 24 and equipment 26 is monitored using the additional SSTDR monitoring units 32. All of this monitoring may be undertaken, if desired, whilst the system 10 is live.

Whilst the arrangement shown in FIGS. 1 and 2 is beneficial in that it achieves an increase in the length of the umbilical 12 that may be monitored, there are applications in which the length of the umbilical 12 will still exceed the length that can be monitored using the arrangement of the invention. FIG. 3, in addition to including the additional SSTDR monitoring units 32, also shows the implementation of the invention in an application in which the length of the umbilical 12 exceeds the length that can be monitored by the first and second SSTDR monitoring units 28, 30. As illustrated in FIG. 3, the umbilical 12 includes a part 12c between the first part 12a (monitored by the first SSTDR monitoring unit 28) and the second part 12b (monitored by the second SSTDR monitoring unit 30) that is not monitored by either of the SSTDR monitoring units 28, 30. It is thought that, whilst it may be preferred for the part 12c to also be monitored, as the part 12c will typically not include any or many connections or splices, the likelihood of faults occurring therein is relatively low. The absence of monitoring of this part 12c of the umbilical 12 is thus not thought to be particularly disadvantageous.

It will be appreciated that the illustrated subsea distribution systems 10 are much simplified, and that in practise the systems may be far more complex, including a large number of component parts performing a wide range of functions. Whilst incorporating the second SSTDR monitoring unit 30 in the subsea distribution unit 16 or in an umbilical termination assembly or unit is convenient, it will be appreciated that the invention is not restricted in this regard and the unit 30 may be located in other parts of the system. Furthermore, the incorporation of a third SSTDR monitoring unit part way along the length of the umbilical to further increase the umbilical length that can be monitored is envisaged.

Whilst the description hereinbefore relates to specific embodiments of the invention, it will be appreciated that a wide range of modifications and alterations may be made thereto without departing from the scope of the invention as defined by the appended claims.

The invention claimed is:

1. A monitoring arrangement for use in monitoring the condition of an umbilical extending continuously between a first location and a second location, the monitoring arrangement comprising a first spread spectrum time domain reflectometry (SSTDR) monitoring unit located at or adjacent the first location and electrically connected to the umbilical at the first location and monitoring the condition of a first part of the umbilical adjacent the first location, and a second SSTDR monitoring unit located at or adjacent the second location and electrically connected to the umbilical at the second location and monitoring the condition of a second part of the umbilical adjacent the second location, wherein the umbilical is of length greater than can be monitored using the first and second SSTDR monitoring units, and a central part of the umbilical between the first part and the second part thereof is not monitored.

2. An arrangement according to claim 1, wherein the umbilical is connected, at the second location, to a subsea distribution unit.

3. An arrangement according to claim 2, wherein the subsea distribution unit is of the non-isolated type and the second SSTDR monitoring unit is further able to monitor the condition of the subsea distribution unit, or parts thereof, and equipment or cables connected thereto.

4. An arrangement according to claim 2 wherein the subsea distribution unit is of the isolated type.

5. An arrangement according to claim 4, further comprising at least one additional SSTDR monitoring unit arranged to permit monitoring of parts of the subsea distribution unit and cable or equipment connected thereto that cannot be monitored by the second SSTDR monitoring unit.

6. An arrangement according to claim 1, wherein the first SSTDR monitoring unit is located within a topside control unit to which the umbilical is connected.

7. An arrangement according to claim 1, wherein the second SSTDR monitoring unit is located within a subsea distribution unit to which the umbilical is connected.

8. An arrangement according to claim 1, wherein the second SSTDR monitoring unit is located within a termination unit associated with the second end of the umbilical.

9. An arrangement according to claim 1, wherein the umbilical is of relatively short length and the first and second parts overlap one another.

10. An arrangement according to claim 1, wherein the umbilical is of length greater than can be monitored using the first and second SSTDR monitoring units, and a central part of the umbilical is not monitored.

11. A subsea electrical distribution system comprising an umbilical extending between a topside control unit at a first location and a subsea distribution unit at a second location, and a monitoring arrangement comprising a first spread spectrum time domain reflectometry (SSTDR) monitoring unit located at or adjacent the first location and electrically connected to the umbilical at the first location and monitoring the condition of a first part of the umbilical adjacent the first location, and a second SSTDR monitoring unit located at or adjacent the second location and electrically connected to the umbilical at the second location and monitoring the condition of a second part of the umbilical adjacent the second location, wherein the umbilical is of length greater than can be monitored using the first and second SSTDR monitoring units, and a central part of the umbilical between the first part and the second part thereof is not monitored.

12. A topside control unit incorporating a first SSTDR monitoring unit and suitable for use in the system of claim 11.

13. A distribution unit including a second SSTDR monitoring unit and suitable for use in the system of claim 11.

14. A monitoring method for use in monitoring the condition of an umbilical extending continuously between a first location and a second location, the monitoring method comprising using a first SSTDR monitoring unit located at or adjacent the first location and electrically connected to the umbilical at the first location to monitor the condition of a first part of the umbilical adjacent the first location, and using a second SSTDR monitoring unit located at or adjacent the second location and electrically connected to the umbilical at the second location to monitor the condition of a second part of the umbilical adjacent the second location, wherein the umbilical is of length greater than can be monitored using the first and second SSTDR monitoring units, and a central part of the umbilical between the first part and the second part thereof is not monitored.

* * * * *